(12) United States Patent
Wang et al.

(10) Patent No.: US 6,207,577 B1
(45) Date of Patent: Mar. 27, 2001

(54) SELF-ALIGNED DUAL DAMASCENE ARRANGEMENT FOR METAL INTERCONNECTION WITH OXIDE DIELECTRIC LAYER AND LOW K DIELECTRIC CONSTANT LAYER

(75) Inventors: Fei Wang; Jerry Cheng, both of San Jose; Darrell M. Erb, Los Altos, all of CA (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 09/238,049

(22) Filed: Jan. 27, 1999

(51) Int. Cl.[7] .................................................. H01L 21/3065
(52) U.S. Cl. ..................... 438/706; 438/710; 438/712; 438/713; 438/714
(58) Field of Search ..................................... 438/689, 706, 438/710, 711, 712, 637, 638, 634, 640

(56) References Cited

U.S. PATENT DOCUMENTS

| | | | |
|---|---|---|---|
| 5,310,454 | * 5/1994 | Ohiwa et al. ........................ | 156/643 |
| 5,340,370 | 8/1994 | Cadien et al. ........................ | 51/308 |
| 5,354,712 | 10/1994 | Ho et al. ............................... | 437/195 |
| 5,612,254 | 3/1997 | Mu et al. .............................. | 137/195 |
| 5,659,201 | 8/1997 | Wollesen .............................. | 257/758 |
| 5,679,608 | 10/1997 | Cheung et al. ...................... | 137/195 |
| 5,693,563 | 12/1997 | Teong .................................... | 137/195 |
| 5,705,430 | 1/1998 | Avanzino et al. .................... | 257/635 |
| 5,736,457 | 4/1998 | Zhao ...................................... | 438/624 |
| 5,739,579 | 4/1998 | Chiang et al. ........................ | 257/635 |
| 5,741,626 | * 4/1998 | Jain et al. .............................. | 438/626 |
| 5,801,094 | * 9/1998 | Yew et al. ............................. | 438/624 |
| 5,817,572 | 10/1998 | Chiang et al. ........................ | 438/624 |
| 5,861,677 | 1/1999 | You et al. ............................. | 257/783 |
| 5,880,018 | * 3/1999 | Boeck et al. ......................... | 438/619 |
| 5,916,823 | * 6/1999 | Lou et al. ............................. | 438/738 |

OTHER PUBLICATIONS

Stanley Wolf and Richard Tauber, Silicon processing the VLSI era, vol. 1, pp 555, 1986.*

* cited by examiner

*Primary Examiner*—Benjamin L. Utech
*Assistant Examiner*—Lan Vinh

(57) ABSTRACT

A method of forming a self-aligned dual damascene structure in a semiconductor device arrangement forms an oxide dielectric material over an underlying metal interconnect layer, such as a copper interconnect layer. A nitride etch stop layer is formed on the oxide dielectric layer, and a low k dielectric layer is formed on the nitride etch stop layer. A trench is etched into the low k dielectric layer, followed by the etching of a via into the oxide dielectric layer. The oxide dielectric material and low k dielectric material are selected so that they have different sensitivity to at least one etchant chemistry. Undercutting in the second dielectric layer caused by overetching is thereby prevented during the etching of the via in the second dielectric layer by employing an etch chemistry that etches only the oxide dielectric material and not the low k dielectric material.

13 Claims, 5 Drawing Sheets

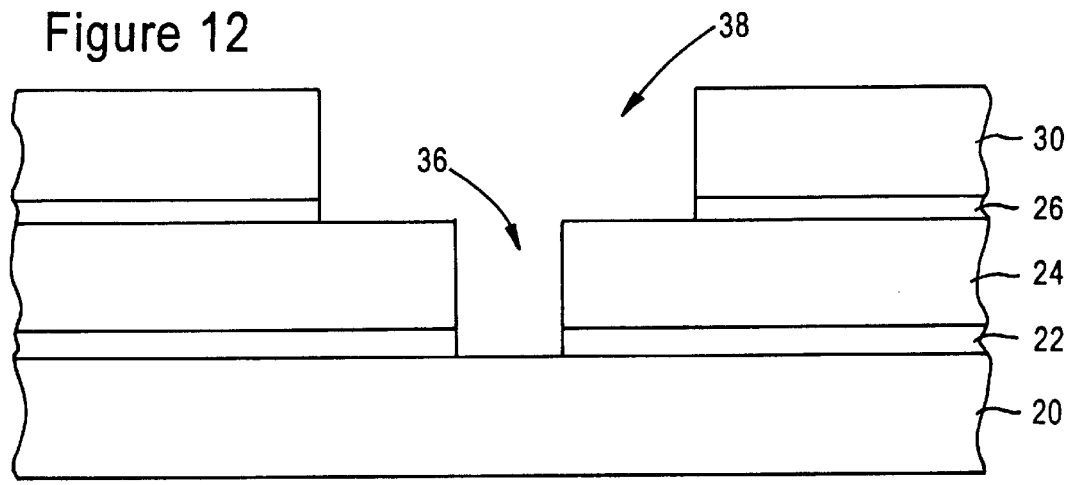
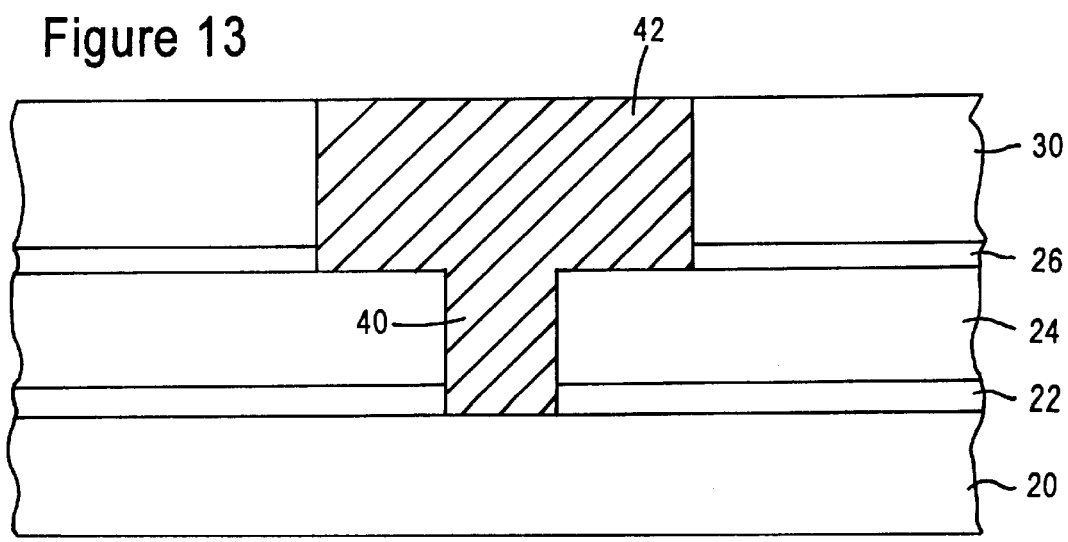

SELF-ALIGNED DUAL DAMASCENE ARRANGEMENT FOR METAL INTERCONNECTION WITH OXIDE DIELECTRIC LAYER AND LOW K DIELECTRIC CONSTANT LAYER

RELATED APPLICATIONS

The present application contains subject matter related to subject matter disclosed in copending U.S. patent applications Ser. No. 09/225,542 filed Jan. 5, 1999, Ser. No. 09/225,215, filed on Jan. 4, 1999 and Ser. No. 09/225,220 filed on Jan. 4, 1999.

FIELD OF THE INVENTION

The present invention relates to the formation of metal interconnection layers during the manufacture of semiconductor devices, and more particularly to the formation of a damascene structure in a metal interconnect region in a self-aligned manner.

BACKGROUND OF THE INVENTION

The escalating requirements for high-density and performance associated with ultra large-scale integration semiconductor wiring require responsive changes in interconnection technology. Such escalating requirements have been found difficult to satisfy in terms of providing a low RC (resistance capacitance) interconnection pattern, particularly where sub-micron via contacts and trenches have high aspect ratios imposed by miniaturization.

Conventional semiconductor devices typically comprise a semiconductor substrate, normally of doped monocrystalline silicon, and a plurality of sequentially formed dielectric layers and conductive patterns. An integrated circuit is formed containing a plurality of conductive patterns comprising conductive lines separated by interwiring spacings, and a plurality of interconnect lines, such as bus lines, bit lines, word lines and logic interconnect lines. Typically, the conductive patterns on different layers, i.e., upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising 5 or more levels of metalization are becoming more prevalent as device geometries shrink to submicron levels.

A conductive plug filling a via hole is typically formed by depositing a dielectric interlayer on a conductive layer comprising at least one conductive pattern, forming an opening in the dielectric interlayer by conventional photolithographic and etching techniques, and filling the opening with a conductive material, such as tungsten (W). Excess conductive material on the surface of the dielectric layer is typically removed by chemical mechanical polishing (CMP). One such method is known as damascene and basically involves forming an opening in the dielectric interlayer and filling the opening with a metal. Dual damascene techniques involve forming an opening comprising a lower contact or via hole section in communication with an upper trench section, which opening is filled with a conductive material, typically a metal, to simultaneously form a conductive plug and electrical contact with a conductive line.

High performance microprocessor applications require rapid speed of semiconductor circuitry. The control speed of semiconductor circuitry varies inversely with the resistance and capacitance of the interconnect pattern. As integrated circuits become more complex and feature sizes and spacings become smaller, the integrated circuit speed becomes less dependent upon the transistor itself and more dependent upon the interconnection pattern. Miniaturization demands long interconnects having small contacts and small cross-sections. Thus, the interconnection pattern limits the speed of the integrated circuit. If the interconnection node is routed over a considerable distance, e.g., hundreds of microns or more as in sub-micron technologies, the interconnection capacitance limits the circuit node capacitance loading, and, hence, the circuit speed. As integration density increases and feature size decreases in accordance with sub-micron design rules, e.g., a design rule of about $0.18\mu$ and below, the rejection rate due to integrated circuit speed delays severely limits production throughput and significantly increases manufacturing costs.

In prior technologies, aluminum was used in very large scale integration interconnect metalizations. Copper and copper alloys have received considerable attention as a candidate for replacing aluminum in these metalizations. Copper has a lower resistivity than aluminum and improved electrical properties vis-à-vis tungsten, making copper a desirable metal for use as a conductive plug as well as conductive wiring.

In the formation of a dual damascene structure in a self-aligned manner, a conductive line and vias that connect the line to conductive elements in a previously formed underlying conductive interconnect layer, are simultaneously deposited. The conductive material is deposited into openings (e.g., via holes and trenches) created in dielectric material that overlays the conductive interconnect layer. Typically, a first layer of dielectric material is deposited over a bottom etch stop layer that covers and protects the conductive interconnect layer. A middle etch stop layer is then deposited over the first dielectric layer. A pattern is then etched into the middle stop layer to define the feature, such as a via hole, that will later be etched into the first dielectric layer. Once the middle etch stop layer is patterned, a second dielectric layer is deposited on the middle etch stop layer. A hard mask layer may then be deposited on the second dielectric layer. A desired feature, such as a trench, is etched through the hard mask layer and the second dielectric layer. This etching continues so that the first dielectric layer is etched in the same step as the second dielectric layer. The etching of the two dielectric layers in a single etching step reduces the number of manufacturing steps. The bottom etch stop layer within the via hole, which has protected the conductive material in the conductive interconnect layer, is then removed with a different etchant chemistry. With the via holes now formed in the first dielectric layer and a trench formed in the second dielectric layer, conductive material is simultaneously deposited in the via and the trench in a single deposition step. (If copper is used as the conductive material, a barrier layer is conventionally deposited first, to prevent copper diffusion.) The conductive material makes electrically conductive contact with the conductive material in the underlying conductive interconnect layer.

In efforts to improve the operating performance of a chip, low k dielectric materials have been increasingly investigated for use as replacements for dielectric materials with higher k values. Lowering the overall k values of the dielectric layers employed in the metal interconnect layers lowers the RC of the chip and improves its performance. However, low k materials, such as benzocyclobutene (BCB), hydrogen silsesquioxane (HSQ), SiOF, and the material sold under the trade name of FLARE, are often more difficult to handle than traditionally employed higher k materials, such as an oxide.

When forming a dual damascene structure in a self-aligned manner in which a low k dielectric material, such as BCB, is substituted for higher k dielectric materials in the two dielectric layers in which the vias and the trench are created, the problem of "undercutting" becomes a concern. Undercutting is the undesired enlargement of one of the holes created in one of the dielectric layers. As seen in FIG. 1 which depicts a cross-section of an interconnect region processed in accordance with the prior art, a trench dielectric layer 16 is overetched during the etching of the trench dielectric layer 16 and a via dielectric layer 12. (The middle etch stop layer 14 was previously etched prior to the deposition of the second dielectric layer 16.) An undercut appears below a hard mask layer 18 and is due to the overetching. The overetching typically occurs to assure adequate etching of the via dielectric layer 12 down to a bottom etch stop layer 12 that overlays the conductive layer 10. The undercutting causes the ultimately formed via structure to be incorrectly shaped and presents a critical dimension control problem in a low k etching process.

There is a need for a method and arrangement that provides a film with a lower overall dielectric constant value that will exhibit improved overall performance, yet avoids the undercutting that occurs with the use of a low k dielectric material in the dielectric layers of a dual damascene interconnect arrangement.

SUMMARY OF THE INVENTION

This and other needs are met by the present invention which provides a method of forming an opening in dielectric interconnect layers in a self-aligned manner by forming a first dielectric layer over a conductive layer. The first dielectric layer comprises an oxide dielectric material. A nitride layer is formed on the first dielectric layer and patterned to define a first dielectric layer opening pattern. A second dielectric layer is formed on the nitride layer. The second dielectric layer comprises a low k dielectric material having different etch sensitivity than the oxide dielectric material to at least one etchant chemistry. A first opening is etched through the second dielectric layer. A second opening is then etched through the first dielectric layer opening pattern in the nitride layer and through the first dielectric layer, the second opening at least partially overlapping the first opening.

The use of an oxide dielectric material and a low k dielectric material in the respective dielectric layers of a dual damascene arrangement that are selected to have different etch sensitivity to at least one etchant chemistry, in accordance with embodiments of the present invention, allows one dielectric layer to be etched without overetching and undercutting the other dielectric layer during a self-aligned dual damascene formation process. At the same time, the overall k value for the film is lowered, since one of the dielectric layers is provided with a low k dielectric material. The use of a low k dielectric material in the second dielectric layer between the metal lines provides the more critical benefit to improve the speed of the semiconductor devices, in comparison to any improvements in the dielectric constant value in the first dielectric layer (e.g., the contact layer).

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

FIG. 12 is a cross-section of the portion of FIG. 11, following etching of the first etch stop layer, in accordance with certain embodiments of the present invention.

FIG. 13 is a cross-section of the portion of FIG. 12 after the first and second features are filled with a conductive material, in accordance with embodiments of the present invention.

DETAILED DESCRIPTION OF THE INVENTION

The present invention solves problems associated with the use of low k dielectric materials in the dielectric layers of a self-aligned dual damascene arrangement in a metal interconnect region of a semiconductor chip. Specifically, the present invention lowers the overall dielectric constant value of the film and avoids undercutting in the second, upper dielectric layer by providing an oxide dielectric material and a low k dielectric material in the two respective dielectric layers in a self-aligned dual damascene arrangement. The oxide dielectric material and the low k dielectric material are selected so as to have different sensitivity to at least one etchant chemistry. This allows the second feature, such as a via, to be etched into the first dielectric layer without simultaneously overetching and thereby undercutting the second dielectric layer.

Figure 2:
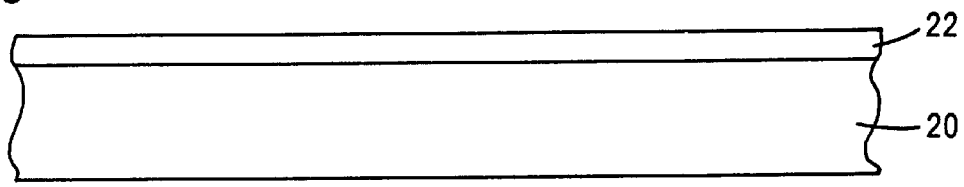
FIG. 2 is a cross-section of a metal interconnect portion of a semiconductor wafer after a first etch stop layer is deposited on an underlying conductive interconnect layer, in accordance with embodiments of the present invention.

FIG. 2 depicts a cross-section of a metal interconnect portion of a chip processed in accordance with embodiments of the present invention, at one stage of the processing. At this stage, a conductive layer 20 has been formed, which may be made of a metal, for example, or other conductive material. In especially preferred embodiments, the conductive material is copper or a copper alloy, due to the earlier stated advantages of copper over other metals. A first etch stop layer 22 is formed, by deposition, for example, over the conductive layer 20. The first etch stop layer 22, in certain embodiments, is made of silicon nitride. The primary purpose of the first etch stop layer 22 is to protect the conductive material during etching of the upper dielectric layers.

Figure 3:
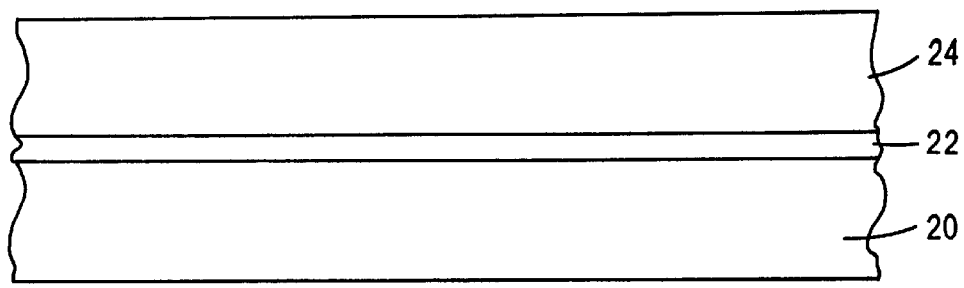
FIG. 3 is a cross-section of the metal interconnect portion of FIG. 2 after a first dielectric layer is formed on the first etch stop layer, in accordance with embodiments of the present invention.

As shown in FIG. 3, a first dielectric layer 24 is then formed on the first etch stop layer 22. The dielectric material in the first dielectric layer 24 is an oxide, such as silicon dioxide, for example. The low k dielectric material may be formed to a desired thickness, depending on the application required. For purposes of example, assume that the first dielectric layer 24 is formed to a thickness of between about 4000 and about 8000 Å. One of the advantages of oxide over a low k dielectric material is the relative ease of handling required in depositing and etching oxide.

Figure 4:
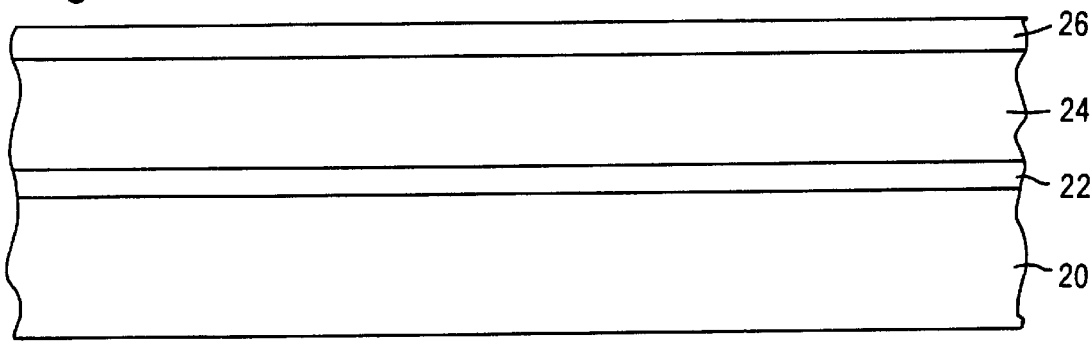
FIG. 4 is a cross-section of the metal interconnect portion of FIG. 3 following deposition of a second etch stop layer, on the first dielectric layer, in accordance with embodiments of the present invention.

A second, middle etch stop layer 26 is deposited on the first dielectric layer 24, as depicted in FIG. 4. The second etch stop layer 26 comprises a nitride, such as silicon nitride, in preferred embodiments of the present invention. The first dielectric layer 24 is partially protected by the second etch stop layer 26 during the etching of the second dielectric layer when the trench is later formed in that layer.

Figure 5:
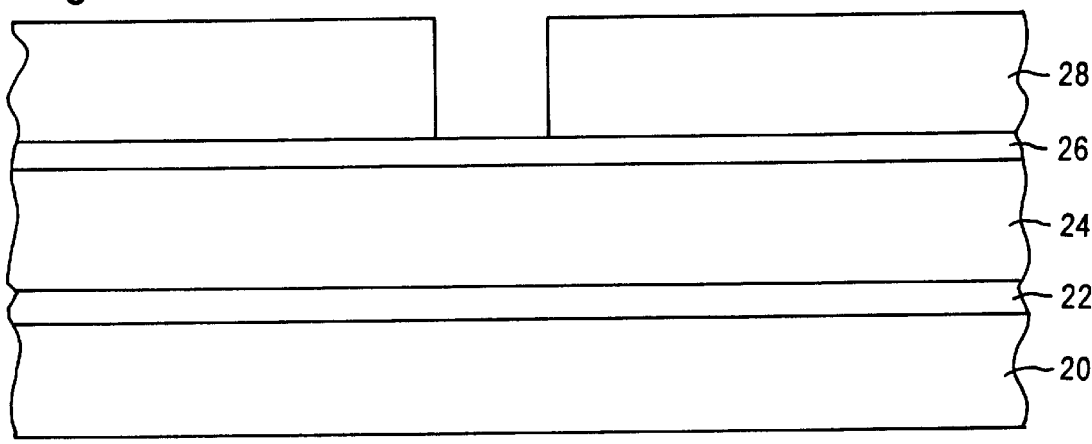
FIG. 5 is a cross-section of the portion of FIG. 4 following the positioning and patterning of a photoresist layer on the second etch stop layer to define a feature to be etched into the second etch stop layer, in accordance with embodiments of the present invention.

FIG. 5 is a cross-section of the metal interconnect portion of FIG. 4 following the positioning and patterning of a photoresist layer 28 on the second etch stop layer 26. The pattern created within the photoresist layer 28 defines the feature, such as a via, that will eventually be etched into the first dielectric layer 24.

Figure 6:
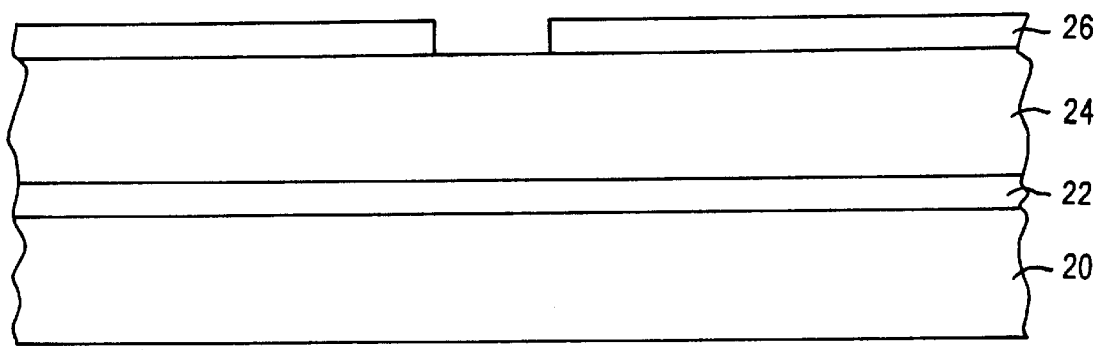
FIG. 6 is a cross-section of the portion of FIG. 5 after the second etch stop layer is etched in accordance with the pattern in the photoresist layer, followed by removal of the photoresist layer, in accordance with embodiments of the present invention.

FIG. 6 depicts the cross-section of FIG. 5 after the second etch stop layer 26 has been etched in accordance with the pattern in the photoresist layer 28. When the second etch stop layer 26 is a nitride, such as silicon nitride, in certain preferred embodiments, the second etch stop layer 26 is etched with an etchant chemistry that is selective to nitride so that the underlying first dielectric layer 24 is not substantially etched. A suitable etchant chemistry is $CHF_3/N_2$.

Figure 7:
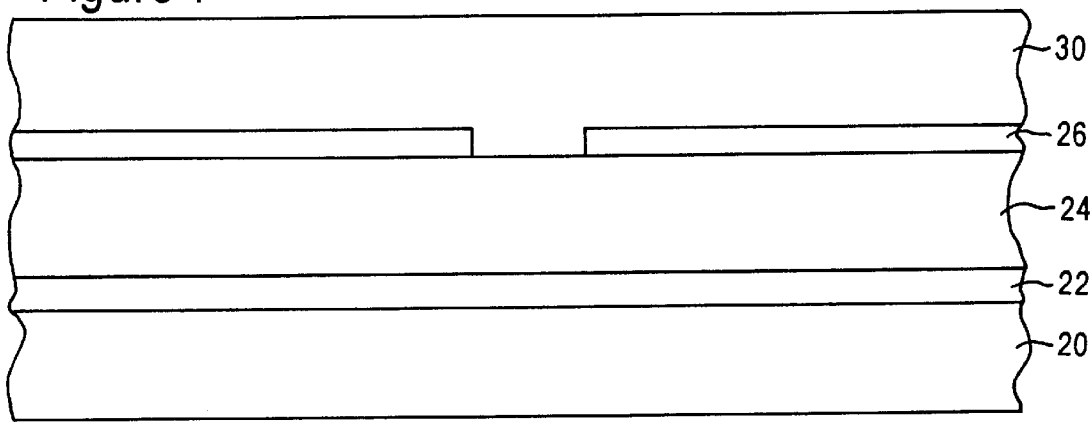
FIG. 7 is a cross-section of the portion of FIG. 6 following the formation of a second dielectric layer on the second etch stop layer, in accordance with embodiments of the present invention.

FIG. 7 is a cross-section of the portion of FIG. 6 following the formation of a second dielectric layer 30 over the second etch stop layer 26. In preferred embodiments of the present invention, the second dielectric layer 30 comprises a low k material that is spin-coated on the second etch stop layer 26. This material may be a polymer based low k dielectric material, such as benzocyclobutene (BCB) or FLARE. Although these materials should be considered exemplary only, whichever low k material is selected for the second dielectric layer 30 needs to have a different sensitivity than the oxide dielectric material in the first dielectric layer 24 to at least one etchant chemistry. This allows the first dielectric layer 24 to be etched while preventing overetching of the second dielectric layer 30.

Figure 8:
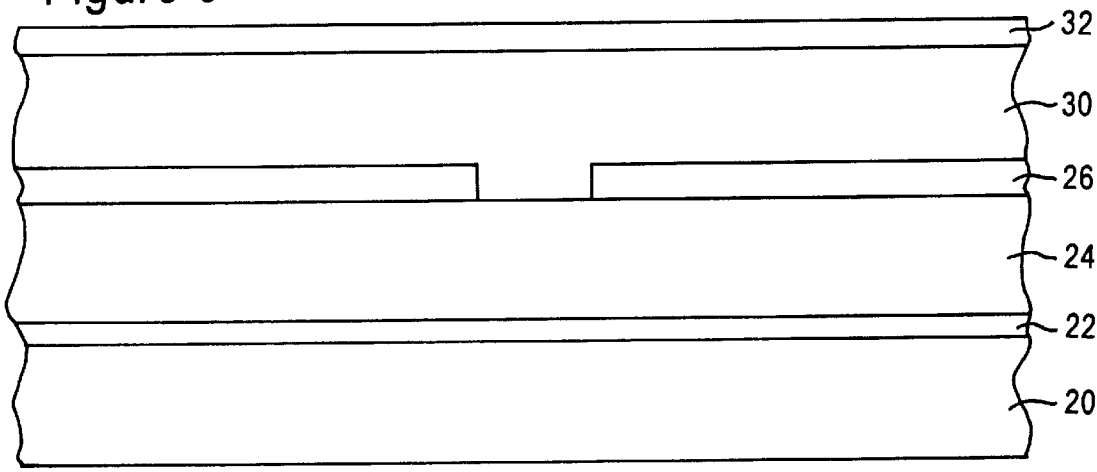
FIG. 8 is a cross-section of the portion of FIG. 7, following the deposition of a hard mask layer on the second dielectric layer, in accordance with embodiments of the present invention.

Following the formation of the second dielectric layer 30, a hard mask layer 32 is deposited on the second dielectric layer 30, as depicted in FIG. 8. The hard mask layer may comprise silicon nitride, for example, and serves to selectively protect the second dielectric layer 30 during the etching steps.

Figure 9:
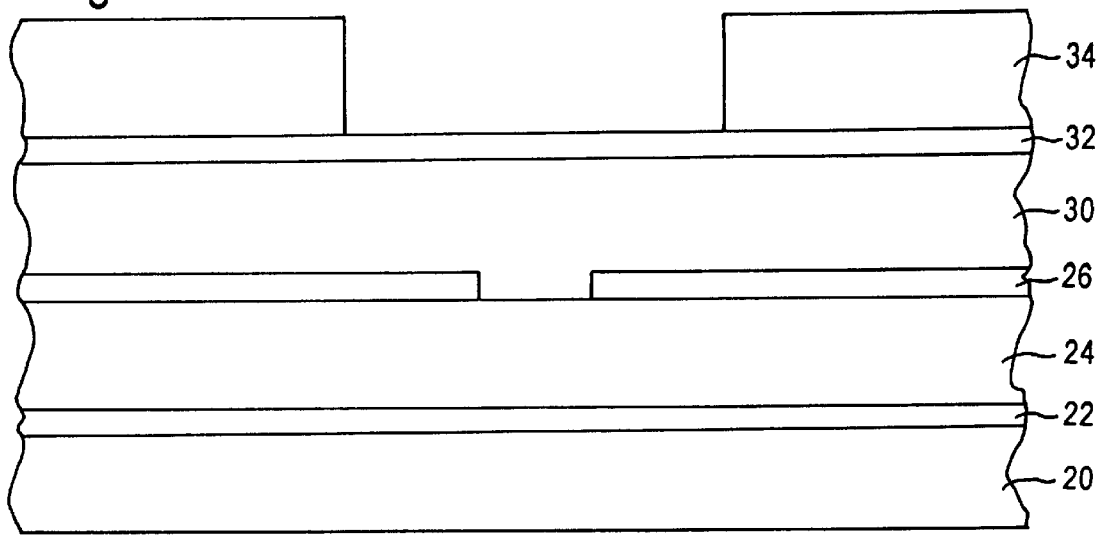
FIG. 9 is a cross-section of the portion of FIG. 8, following the positioning and patterning of a photoresist layer on the second dielectric layer to define a first feature to be etched in the second dielectric layer, in accordance with embodiments of the present invention.

As shown in FIG. 9, a photoresist layer 34 is then positioned and patterned on the hard mask layer 32. The pattern in the photoresist layer 34 contains the feature that is to be etched into the second dielectric layer 30.

Figure 10:
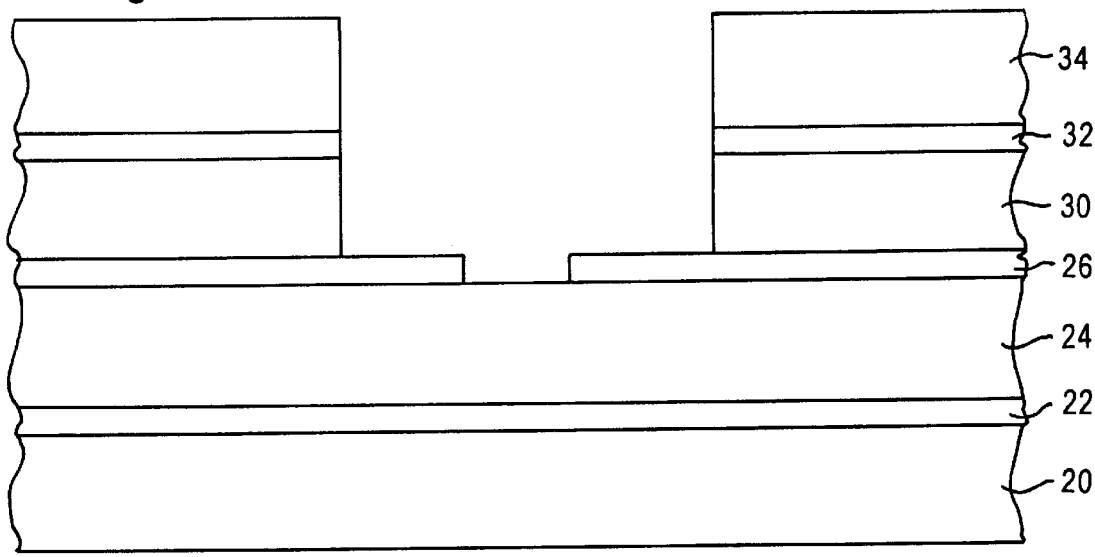
FIG. 10 is a cross-section of the portion of FIG. 9, after etching through the hard mask layer and the second dielectric layer in accordance with the pattern in the photoresist layer to create a first feature in the second dielectric layer, in accordance with embodiments of the present invention.

The desired feature, such as a trench opening (a "first" opening), is created (FIG. 10) by etching the hard mask layer 32 and the second dielectric layer 30. The etching stops at the second etch stop layer 26. A first etchant recipe may be employed that etches both the hard mask layer 32 and the second dielectric layer 30. However, in preferred embodiments of the invention, multiple etching steps are used to create the structure depicted in FIG. 10. These include etching the hard mask layer 32, followed by etching the second dielectric layer 30. The photoresist layer 34 is typically removed by the etching process. If not, a photoresist layer removal step can be performed.

A suitable etchant chemistry for etching the nitride hard mask layer 32 is $CHF_3/N_2$. The etchant chemistry employed to etch the second dielectric layer 30 (in this embodiment, a polymer based low k material) is $N_2/H_2/O_2$, or $N_2/H_2$ if the use of oxygen is to be avoided. For example, oxygen should not be used if HSQ is employed in the structure, as $O_2$ will damage the HSQ film. Also, the lack of $O_2$ in the etch process increases sidewall control during the etching of the polymer based dielectric layer. A slight amount of fluorine gas may be used in the etching of the low k polymer, depending on the specific polymer used, such as for BCB. A suitable etchant chemistry for etching the second, middle etch stop layer 26, which in the exemplary embodiment is a nitride, is again $CHF_3/N_2$. Finally, the first dielectric layer 24, comprising an oxide dielectric material, is etched with $C_4F_8/Ar/O_2/CO$. Alternative etchant chemistries for etching the first dielectric layer 14 may be $C_4F_8/Ar$ or $C_4F_8/C_2F_6$, for a non-oxygen process. The above listed etchant chemistries are exemplary only, as other chemistries may be employed without departing from the scope of the invention. The choice of the chemistry is selected based on the selectivity to the underlayer, etch rate and uniformity, and etch profile considerations, as is known to those of ordinary skill in the art.

Figure 1:
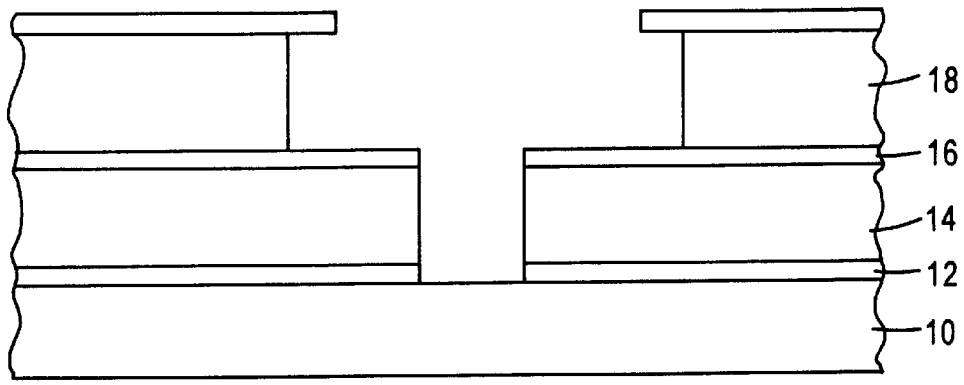
FIG. 1 is a cross-section of a dual damascene arrangement in the metal interconnect portion of a semiconductor wafer manufactured in accordance with the prior art, depicting an undercut in the upper dielectric layer of the dual dielectric layers.
Figure 11:
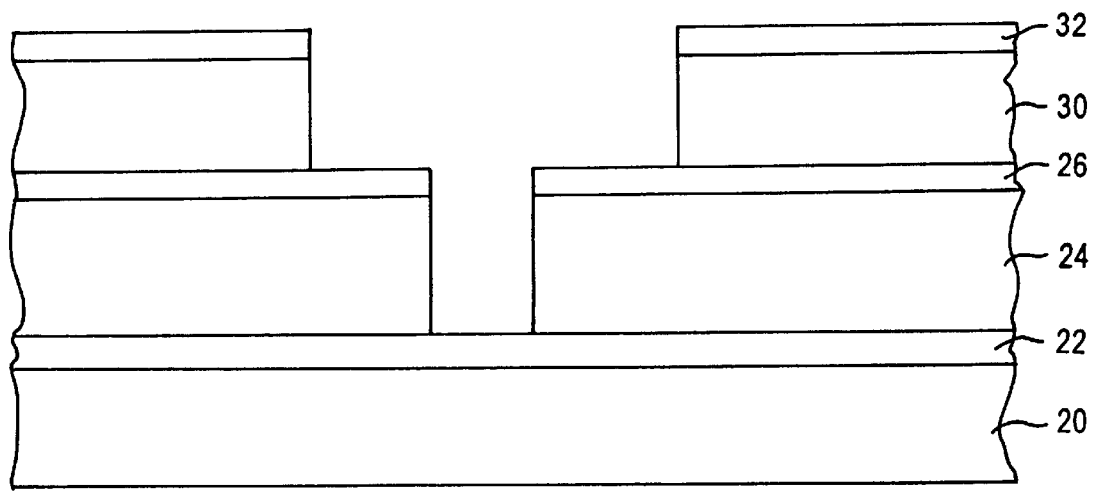
FIG. 11 is a cross-section of the portion of FIG. 10, after etching of the first dielectric layer to form the second feature and removal of the photoresist layer, in accordance with embodiments of the present invention.

As depicted in FIG. 11, the first dielectric layer 24 is now etched to create the second opening, such as a via hole. It is undesirable to etch the second dielectric layer 30 any further during this step, as it creates a problem in critical dimension control. See, for example, the overetching of the second dielectric layer depicted in FIG. 1. Further etching of the second dielectric layer 30 is only partially prevented by the hard mask layer 32. Etching of the second dielectric layer 30 in an undercutting fashion that would not be prevented by the hard mask layer 32 is nonetheless avoided by the use of an etchant chemistry that does not significantly etch the low k dielectric material in the second dielectric layer 30. For example, an etchant chemistry that etches the oxide based dielectric material in the first dielectric layer 24, but does not undercut the polymer based low k dielectric material in the second dielectric layer 30, is $C_4F_8/Ar/C_2F_6$, as described above. This is exemplary only, as other etchant chemistries may be used, provided they will etch the first dielectric layer 24 and not the second dielectric layer 30.

The first etch stop layer 22 is now etched within the first opening that now exists in the first dielectric layer 24, as seen in FIG. 12. This removes the etch stop material covering the conductive material in the conductive layer 20. A suitable etchant to remove the etch stop material, for example silicon nitride, while not adversely affecting the conductive material (e.g., copper) is $CHF_3/N_2$. This etchant chemistry prevents copper oxidation, removes sidewall polymer with N2, and etches the nitride without undercutting the low k polymer in the second dielectric layer 30 or the oxide in the first dielectric layer 24. The etching of the first etch stop layer 22 leaves a first opening 36, such as a via hole, and a second opening 38, such as a trench. Since the use of oxygen may be avoided throughout the etching process, damage to the low k polymer is avoided, as well as undercutting of the low k polymer or the oxide in the dielectric layers.

The via hole 36 and the trench 38 are now filled in a simultaneous deposition step with conductive material, preferably copper in certain embodiments of the present invention. The deposition of a barrier layer, typically employed to prevent copper diffusion, is not depicted in order not to obscure the invention. Also, in certain embodiments of the invention, a barrier layer is not needed as certain low k dielectric materials form a self-barrier against copper diffusion. After chemical mechanical planarization (CMP), the dual damascene structure of FIG. 13 is formed, having a via (or stud) 40 electrically connecting the underlying conductive layer 20 to a conductive line 42 formed in the trench 38.

The use of different types of low k dielectric materials that exhibit different sensitivity to at least one etchant chemistry, permits the use of low k dielectric materials in at least one of the multiple layers of a dual damascene arrangement, while avoiding the concern of undercutting in one of the dielectric layers. This use of low k dielectric materials provides a chip with lower overall RC and therefore an improved operating speed. At the same time, the use of oxide in one of the dielectric layers simplifies processing in comparison to using low k materials in both of the dielectric layers.

Although the present invention has been described and illustrated in detail, it is to be early understood that the same is by way of illustration and example only and is not to be taken by way of limitation, the spirit and scope of the present invention being limited only by the terms of the appended claims.

What is claimed is:

1. A method of forming an opening in dielectric interconnect layers in a self-aligned manner, comprising the steps of:

forming a first dielectric layer over a conductive layer, the first dielectric layer comprising an oxide dielectric material;

forming a nitride layer on the first dielectric layer;

patterning the nitride layer to define a first dielectric layer opening pattern;

forming a second dielectric layer on the nitride layer, the second dielectric layer comprising a low k dielectric material having different etch sensitivity than the oxide dielectric material to at least one etchant chemistry;

etching a first opening in the second dielectric layer; and etching a second opening through the first dielectric layer opening pattern in the nitride layer and through the first dielectric layer, the first opening at least partially overlapping the second opening.

2. The method of claim 1, wherein the first opening is etched with $N_2/H_2/O_2$, the nitride layer with $CHF_3/N_2$, and the oxide dielectric materials etched with $C_4F_8/Ar/O_2/CO$.

3. The method of claim 1, wherein the conductive layer comprises copper or a copper alloy.

4. The method of claim 1, wherein the low k dielectric material is a silicon dioxide based material.

5. The method of claim 4, wherein the low k dielectric material is selected from one of hydrogen silsesquioxane (HSQ) and SiOF.

6. The method of claim 1, wherein the low k dielectric material is a polymer based material.

7. The method of claim 6, wherein the low k dielectric material is selected from one of Benzocyclobutene (BCB) and a low k polymer synthesized from perflourobiphenyl with aromatic bisphenols.

8. The method of claim 1, further comprising forming a hard mask layer on the second dielectric layer prior to etching the first and second openings.

9. The method of claim 8, wherein etching the first opening includes creating a second dielectric layer opening pattern in the hard mask layer and etching the first opening through the second dielectric layer in accordance with the second dielectric opening pattern in the hard mask layer.

10. The method of claim 9, wherein the step of etching the first opening includes using a first etchant chemistry that substantially etches only the second dielectric layer.

11. The method of claim 1, wherein the etching of the first opening and the etching of the second opening and the patterning of the nitride layer are performed with oxygen-free chemistries.

12. The method of claim 11, wherein the first opening is etched with $N_2/H_2$, the nitride layer with $CHF_3/N_2$, and the oxide dielectric material is etched with at least one of $C_4F_8/Ar$ and $C_4F_8/C_2F_6$.

13. The method of claim 12, wherein etching the second opening includes using an etchant chemistry that etches only the first dielectric layer so as to substantially avoid etching the second dielectric layer.

* * * * *